US010186203B2

(12) United States Patent
Park et al.

(10) Patent No.: US 10,186,203 B2
(45) Date of Patent: Jan. 22, 2019

(54) GATE DRIVING UNIT AND DISPLAY DEVICE INCLUDING THE SAME

(71) Applicant: LG Display Co., Ltd., Seoul (KR)

(72) Inventors: Hyun-Ho Park, Chilgok-gun (KR); Key-Young Yang, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 10 days.

(21) Appl. No.: 15/232,618

(22) Filed: Aug. 9, 2016

(65) Prior Publication Data

US 2017/0047018 A1 Feb. 16, 2017

(30) Foreign Application Priority Data

Aug. 13, 2015 (KR) .......................... 10-2015-0114735

(51) Int. Cl.
*G09G 3/36* (2006.01)
*G09G 3/3266* (2016.01)
*G11C 19/28* (2006.01)

(52) U.S. Cl.
CPC ......... *G09G 3/3266* (2013.01); *G09G 3/3677* (2013.01); *G11C 19/287* (2013.01); *G09G 2300/0413* (2013.01); *G09G 2310/08* (2013.01)

(58) Field of Classification Search
CPC ............................ G09G 3/3674; G09G 3/3677
USPC ..................................................... 345/99, 100
See application file for complete search history.

(56) References Cited

U.S. PATENT DOCUMENTS

2009/0167668 A1* 7/2009 Kim .................... G09G 3/3677
345/100

FOREIGN PATENT DOCUMENTS

KR 10-2015-0059005 A 5/2015

OTHER PUBLICATIONS

English language abstract of KR 10-2015-0059005 A, published May 29, 2015.

* cited by examiner

*Primary Examiner* — Roy P Rabindranath
(74) *Attorney, Agent, or Firm* — Polsinelli PC (57) ABSTRACT

A gate driving unit includes first to nth stages sequentially outputting first to nth gate pulses, respectively, according to a start signal, wherein n is an integer larger than 2; and a dummy stage receiving the nth gate pulse, charging an (n+1)th Q node and outputting a dummy pulse synchronized with a clock signal, the dummy stage receiving a reset signal and discharging the (n+1)th Q node, wherein the first to nth stages receive the reset signal and charge first QB to nth QB nodes, respectively.

18 Claims, 6 Drawing Sheets

GATE DRIVING UNIT AND DISPLAY DEVICE INCLUDING THE SAME

CROSS-REFERENCE TO RELATED APPLICATION

The present application claims priority under U.S.C § 119(a) to Korean Patent Application No. 10-2015-0114735 filed in the Republic of Korea on Aug. 13, 2015, which is hereby incorporated by reference in its entirety.

BACKGROUND

Field of the Disclosure

The present disclosure relates to a gate driving unit and a display device including the same, and more particularly, to a gate driving unit and a display device including the same that prevent deterioration in charge capability of a node of a dummy stage.

Discussion of the Related Art

With rapid development of information technologies, various types of display devices for displaying images have been required. Recently, flat panel display (FPD) devices such as liquid crystal display (LCD) devices, plasma display panel (PDP) devices, and organic light emitting diode display (OLED) devices have been widely developed and applied to various fields.

These display devices include drivers for driving the display devices. The driver includes a gate driving unit for sequentially supplying gate pulses to gate lines and a data driving unit for supplying video signals (i.e., data voltages) to data lines.

Particularly, the gate driving unit includes a plurality of stages for sequentially generating gate pulses.

Figure 1:
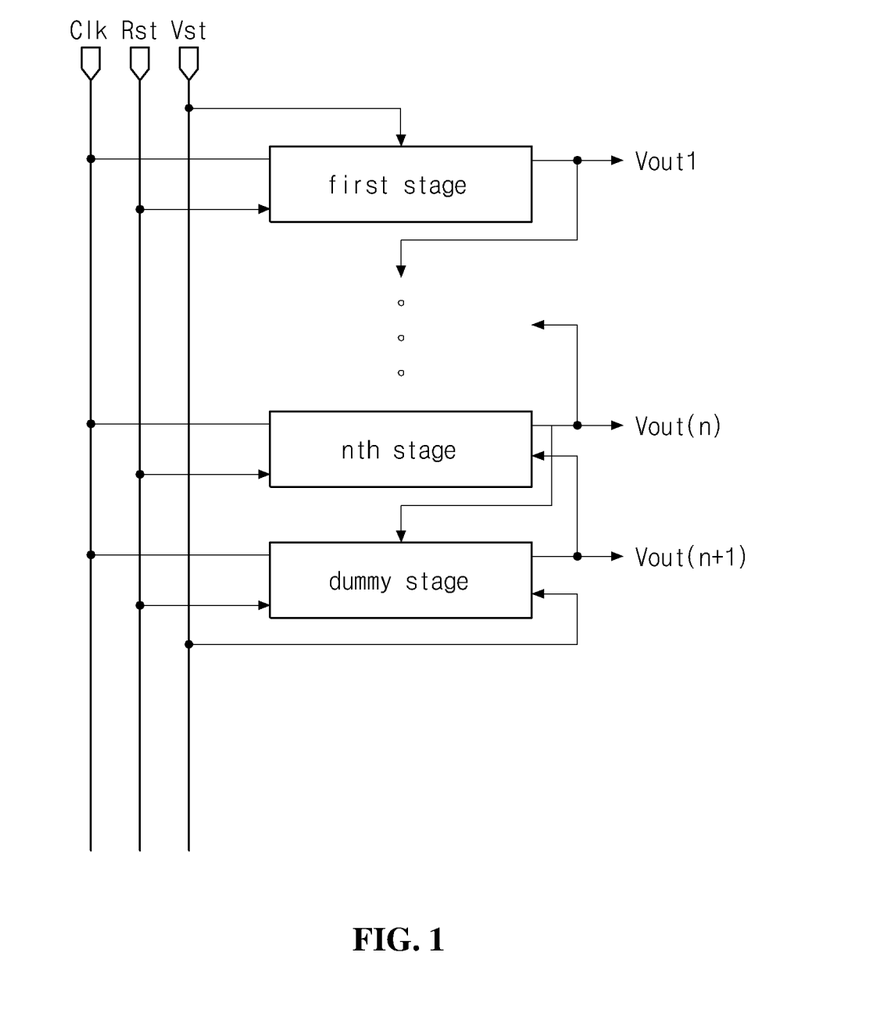
FIG. 1 is a view showing stages of a gate driving unit according to the related art.
Figure 2:
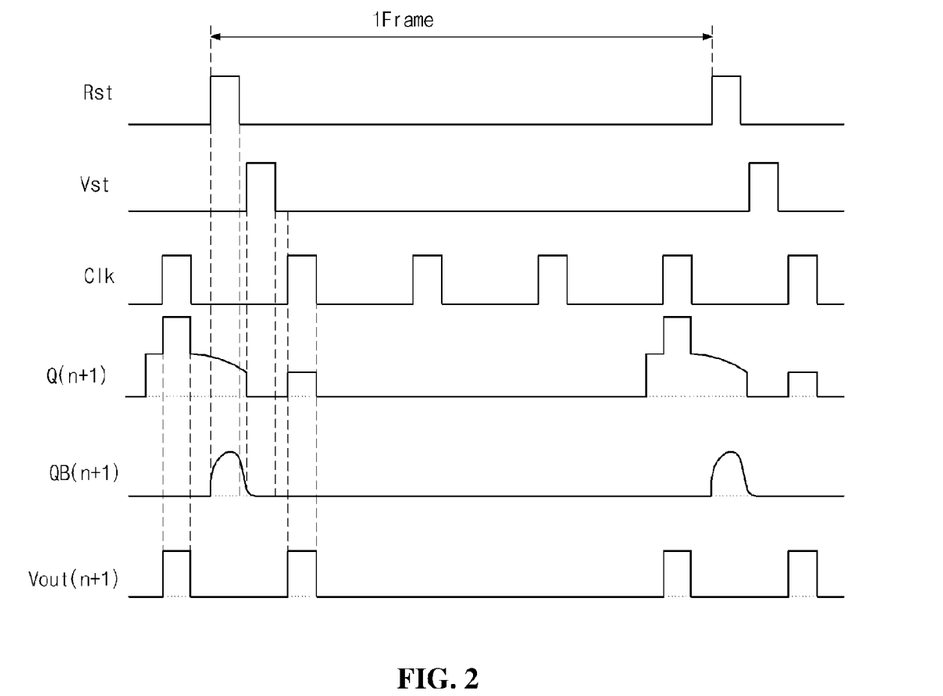
FIG. 2 is a timing chart showing input signals to a dummy stage of FIG. 1, an (n+1)th Q node voltage of the dummy stage, an (n+1)th QB node voltage of the dummy stage, and a dummy pulse outputted from the dummy stage.

FIG. 1 is a view showing stages of a gate driving unit according to the related art. FIG. 2 is a timing chart showing input signals to a dummy stage of FIG. 1, an (n+1)th Q node voltage of the dummy stage, an (n+1)th QB node voltage of the dummy stage, and a dummy pulse outputted from the dummy stage.

In FIG. 1 and FIG. 2, the gate driving unit according to the related art includes first to nth (n is an integer larger than 2) stages and a dummy stage. The first to nth stages sequentially output first to nth gate pulses Vout1 to Vout(n), respectively, according to a start signal Vst. The dummy stage receives the nth gate pulse Vout(n) and outputs a dummy pulse Vout(n+1).

More specifically, the first stage receives the start signal Vst and outputs the first gate pulse Vout1 by using a clock signal Clk inputted to the first stage. At this time, the first gate pulse Vout1 outputted from the first stage is inputted to the next stage, thereby starting the next stage.

Next, the nth stage receives the gate pulse outputted from the previous stage and outputs the nth gate pulse Vout(n) by using the clock signal Clk inputted to the nth stage. At this time, the nth gate pulse Vout(n) outputted from the nth stage is inputted to the previous stage, thereby resetting the previous stage, and is inputted to the dummy stage, thereby starting the dummy stage.

Next, the dummy stage receives the nth gate pulse Vout(n) outputted from the nth stage and outputs the dummy pulse Vout(n+1) by using the clock signal Clk inputted to the dummy stage. At this time, the dummy pulse Vout(n+1) outputted from the dummy stage is inputted to the nth stage, thereby resetting the nth stage.

In addition, the dummy stage receives the start signal Vst and is reset.

Meanwhile, every time a frame ends, the first to nth stages and the dummy stage receive a reset signal Rst to prepare a next frame.

The reset signal Rst, the start signal Vst and the clock signal Clk are inputted to the gate driving unit during one frame. The reset signal Rst for resetting the previous frame is first inputted and then the start signal Vst for starting the present frame is inputted for the frame. In addition, the clock signal Clk is periodically inputted with a predetermined interval.

At this time, the first clock signal Clk of the present frame is inputted after the start signal Vst is inputted.

Hereinafter, a process of outputting the dummy pulse Vout(n+1) from the dummy stage will be described.

The nth gate pulse Vout(n) outputted from the nth stage is inputted to the dummy stage, and an (n+1)th Q node (Q(n+1)) of the dummy stage is charged to have a high level voltage Vdd. The dummy pulse Vout(n+1) corresponding to the clock signal Clk is outputted from the dummy stage by the high level voltage Vdd of the (n+1)th Q node (Q(n+1)).

In the meantime, threshold voltages of transistors included in the dummy stage are shifted toward a (+) direction in proportion to an accumulated amount of a positive bias stress (PBTS) or shifted toward a (−) direction in proportion to an accumulated amount of a negative bias stress (NBTS).

Especially, the positive bias stress PBTS is accumulated at gate electrodes of the transistors switched corresponding to a voltage of an (n+1)th QB node (QB(n+1)). The positive bias stress PBTS proportionally increases as driving time passes, and the corresponding transistors are degraded.

Since the transistors switched corresponding to the voltage of the (n+1)th QB node QB(n+1) are degraded by the positive bias stress PBTS, an ability of discharging the charged (n+1)th Q node Q(n+1) is lowered, and an ability of charging the (n+1)th QB node QB(n+1) is lowered.

Namely, the charged (n+1)th Q node (Q(n+1)) of the dummy stage is discharged by the start signal Vst, and the (n+1)th QB node QB(n+1) is charged by the reset signal Rst faster than the start signal Vst. Since the charged (n+1)th Q node Q(n+1) is not completely discharged, the ability of charging the (n+1)th QB node (QB(n+1)) is lowered.

Thus, the (n+1)th QB node (QB(n+1)) is not sufficiently charged, and the charged (n+1)th QB node (QB(n+1)) is easily discharged. When the charged (n+1)th QB node (QB(n+1)) is discharged, the (n+1)th Q node (Q(n+1)) is recharged corresponding to the clock signal Clk.

In addition, the dummy pulse Vout(n+1) is outputted again due to a voltage of the recharged (n+1)th Q node (Q(n+1)).

As a result, the dummy pulse Vout(n+1) is outputted from the dummy stage twice every frame. The nth stage is reset two times by the twice outputted dummy pulse Vout(n+1), and this causes a problem of lowering an image quality of the display device.

SUMMARY

Accordingly, the present disclosure is directed to a gate driving unit and a display device including the same that substantially obviate one or more of the problems due to limitations and disadvantages of the related art.

An object of the present disclosure is to provide a gate driving unit and a display device including the same that prevent an ability of charging a node from being lowered even if transistors are degraded by a positive bias stress.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, there is provided a gate driving unit includes first to nth stages sequentially outputting first to nth gate pulses, respectively, according to a start signal, wherein n is an integer larger than 2; and a dummy stage receiving the nth gate pulse, charging an (n+1)th Q node and outputting a dummy pulse synchronized with a clock signal, the dummy stage receiving a reset signal and discharging the (n+1)th Q node, wherein the first to nth stages receive the reset signal and charge first QB to nth QB nodes, respectively.

In another aspect, a display device includes a display panel including gate lines and data lines crossing each other; a data driving unit connected to the data lines; a gate driving unit connected to the gate lines and including first to nth stages and a dummy stage, wherein the first to nth stages sequentially output first to nth gate pulses, respectively, according to a start signal, wherein n is an integer larger than 2, wherein the dummy stage receives the nth gate pulse, charges an (n+1)th Q node and outputs a dummy pulse synchronized with a clock signal, and the dummy stage receives a reset signal and discharges the (n+1)th Q node, and wherein the first to nth stages receive the reset signal and charge first QB to nth QB nodes, respectively; and a timing controller controlling the data driving unit and the gate driving unit.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to the embodiment of the disclosure, an example of which is illustrated in the accompanying drawings.

Figure 3:
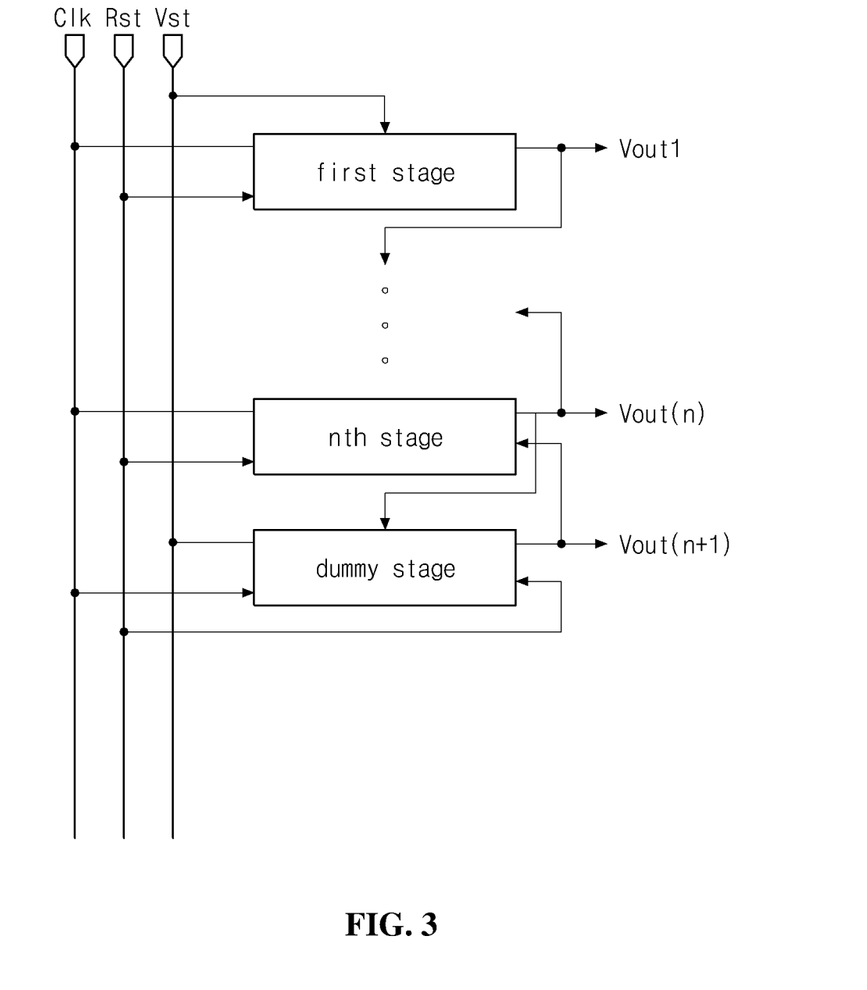
FIG. 3 is a view showing stages of a gate driving unit according to an embodiment of the present disclosure.
Figure 4:
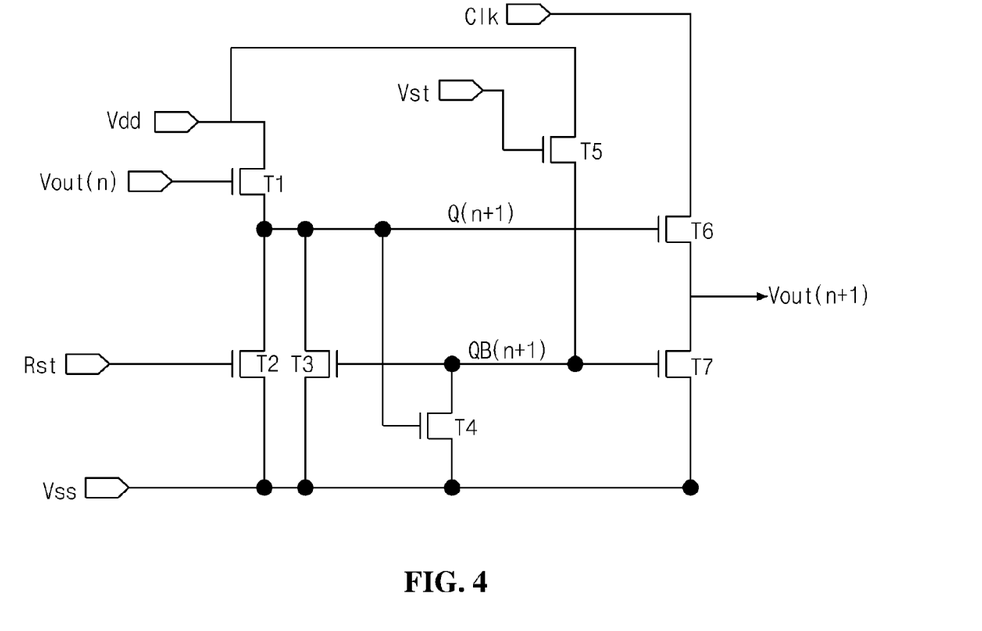
FIG. 4 is a circuit diagram of a dummy stage of the gate driving unit of FIG. 3.
Figure 5:
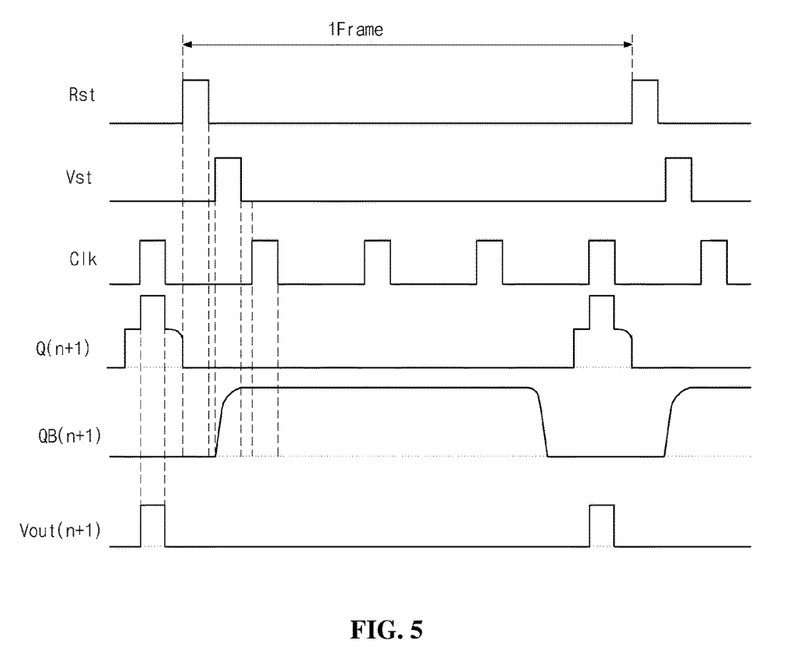
FIG. 5 is a timing chart showing input signals to the dummy stage of FIG. 4, an (n+1)th Q node voltage of the dummy stage, an (n+1)th QB node voltage of the dummy stage, and a dummy pulse outputted from the dummy stage.

FIG. 3 is a view showing stages of a gate driving unit according to an embodiment of the present disclosure. FIG. 4 is a circuit diagram of a dummy stage of the gate driving unit of FIG. 3. FIG. 5 is a timing chart showing input signals to the dummy stage of FIG. 4, an (n+1)th Q node voltage of the dummy stage, an (n+1)th QB node voltage of the dummy stage, and a dummy pulse outputted from the dummy stage.

In FIG. 3, FIG. 4 and FIG. 5, the gate driving unit according to the embodiment of the present disclosure includes first to nth (n is an integer larger than 2) stages and a dummy stage.

At this time, the first to nth stages sequentially output first to nth gate pulses Vout1 to Vout(n), respectively, according to a start signal Vst. The dummy stage receives the nth gate pulse Vout(n), charges an (n+1)th Q node (Q(n+1)), and outputs a dummy pulse Vout(n+1) synchronized with a clock signal Clk. The dummy stage receives a reset signal Rst and discharges the (n+1)th Q node (Q(n+1)).

Moreover, the nth stage receives a gate pulse of a previous stage, that is, the (n−1)th stage, and charges an nth Q node (Q(n)). The nth stage receives the dummy pulse Vout(n+1) and discharges the nth Q node (Q(n)).

Furthermore, the first to nth stages receive the reset signal Rst and charge first QB to nth QB nodes (QB1 to QB(n)), respectively. The dummy stage receives the start signal Vst and charges an (n+1)th QB node (QB(n+1)).

Therefore, the dummy stage receives the reset signal Rst and discharges the charged (n+1)th Q node (Q(n+1)). Then, the dummy stage charges the (n+1)th QB node (QB(n+1)) according to the start signal Vst sequentially outputted after the reset signal Rst is outputted. Accordingly, a discharging section of the (n+1)th Q node (Q(n+1)) does not overlap a charging section of the (n+1)th QB node (QB(n+1)).

That is, when the (n+1)th QB node (QB(n+1)) is charged, the (n+1)th QB node (QB(n+1)) is not influenced by a voltage of the (n+1)th Q node (Q(n+1)), which is not completely discharged. Thus, the (n+1)th QB node (QB(n+1)) is sufficiently charged to have an enough voltage for operation.

Hereinafter, a process of outputting the gate pulses and the dummy pulse from the stages will be described with reference to FIG. 3.

Here, since there is no previous stage before the first stage and the first stage cannot receive a gate pulse from the previous stage, the first stage receives the start signal Vst to start.

First, the start signal Vst is inputted to the first stage, and the first stage outputs the first gate pulse Vout1 using the clock signal Clk inputted to the first stage.

At this time, the first gate pulse Vout1 is inputted to a next stage, that is, the second stage, thereby starting the next stage.

Next, the nth stage receives the gate pulse outputted from the previous stage and outputs the nth gate pulse Vout(n) using the clock signal Clk inputted to the nth stage.

At this time, the nth gate pulse Vout(n) is inputted to the previous stage, thereby resetting the previous stage, and is inputted to the dummy stage, thereby starting the dummy stage.

Next, the dummy stage receives the nth gate pulse Vout(n) outputted from the nth stage and outputs the dummy pulse Vout(n+1) using the clock signal Clk inputted to the dummy stage.

At this time, the dummy pulse Vout(n+1) is inputted to the nth stage, thereby resetting the nth stage.

Meanwhile, since there is no next stage after the dummy stage, the dummy stage receives the reset signal Rst to be reset.

In addition, every time a frame ends, the first to nth stages receive the reset signal Rst and the dummy stage receives the start signal Vst to prepare a next frame.

In FIG. 4, the dummy stage of the gate driving unit according to the embodiment of the present disclosure includes a first charge and discharge portion, a second charge and discharge portion, a pull-up transistor T6 and a pull-down transistor T7. The first charge and discharge portion charges and discharges the (n+1)th Q node (Q(n+1)). The second charge and discharge portion charges and discharges the (n+1)th QB node (QB(n+1)). The pull-up transistor T6 outputs the dummy pulse Vout(n+1), and the pull-down transistor T7 outputs a low level voltage Vss.

In detail, the first charge and discharge portion includes first, second and third transistors T1, T2 and T3.

At this time, the first transistor T1 includes a gate electrode connected to an nth gate pulse Vout(n) output terminal, a first electrode connected to a high level voltage Vdd terminal, and a second electrode connected to the (n+1)th Q node (Q(n+1)). The second transistor T2 includes a gate electrode connected to a reset signal Rst line, a first electrode connected to the (n+1)th Q node (Q(n+1)), and a second electrode connected to a low level voltage Vss terminal. The third transistor T3 includes a gate electrode connected to the (n+1)th QB node (QB(n+1)), a first electrode connected to the (n+1)th Q node (Q(n+1)), and a second electrode connected to the low level voltage Vss terminal.

In addition, the second charge and discharge portion includes fourth and fifth transistors T4 and T5.

At this time, the fourth transistor T4 includes a gate electrode connected to the (n+1)th Q node (Q(n+1)), a first electrode connected to the (n+1)th QB node (QB(n+1)), and a second electrode connected to the low level voltage Vss terminal. The fifth transistor Ts includes a gate electrode connected to a start signal Vst line, a first electrode connected to the high level voltage Vdd terminal, and a second electrode connected to the (n+1)th QB node (QB(n+1)).

Moreover, the pull-up transistor T6 includes a gate electrode connected to the (n+1)th Q node (Q(n+1)), a first electrode connected to a clock signal Clk line, and a second electrode connected to a dummy pulse Vout(n+1) output terminal. The pull-down transistor T7 includes a gate electrode connected to the (n+1)th QB node (QB(n+1)), a first electrode connected to the dummy pulse Vout(n+1) output terminal, and a second electrode connected to the low level voltage Vss terminal.

Hereinafter, a driving process of the dummy stage of the gate driving unit according to the embodiment of the present disclosure will be explained with reference to FIG. 4 and FIG. 5.

During one frame, the reset signal Rst for resetting the previous frame is outputted, and then the start signal Vst for starting the present frame is outputted. Next, the clock signal Clk is periodically outputted with a predetermined interval.

First, when the nth gate pulse Vout(n) from the nth stage is inputted to the first transistor T1, the first transistor T1 turns on, and the (n+1)th Q node (Q(n+1)) is charged to have the high level voltage Vdd.

At this time, the fourth transistor T4 turns on by the high level voltage Vdd of the charged (n+1)th Q node (Q(n+1)), and the (n+1)th QB node (QB(n+1)) having the high level voltage Vdd is discharged to have the low level voltage Vss.

In addition, the pull-up transistor T6 turns on by the high level voltage Vdd of the charged (n+1)th Q node (Q(n+1)) and outputs the dummy pulse Vout(n+1) corresponding to the clock signal Clk to the dummy pulse Vout(n+1) output terminal.

Next, when the reset signal Rst is inputted to the second transistor T2, the second transistor T2 turns on, and the (n+1)th Q node (Q(n+1)) having the high level voltage Vdd is discharged to have the low level voltage Vss.

Next, when the start signal Vst is inputted to the fifth transistor T5, the fifth transistor T5 turns on, and the (n+1)th QB node (QB(n+1)) is charged to have the high level voltage Vdd.

Like this, the reset signal Rst and the start signal Vst, which are sequentially outputted, are inputted to the second transistor T2 and the fifth transistor T5, respectively, and thus there is no overlap between a discharging section of the (n+1)th Q node (Q(n+1)) and a charging section of the (n+1)th QB node (QB(n+1)).

In addition, when the start signal Vst is inputted to the fifth transistor T5, the pull-down transistor T7 turns on by the high level voltage Vdd of the charged (n+1)th QB node (QB(n+1)) and outputs the low level voltage Vss to the dummy pulse Vout(n+1) output terminal.

Moreover, the third transistor T3 turns on by the high level voltage Vdd of the charged (n+1)th QB node (QB(n+1)) and maintains the low level voltage Vss of the (n+1)th Q node (Q(n+1)).

Therefore, the gate driving unit according to the present disclosure differs the discharging section of the (n+1)th Q node (Q(n+1)) from the charging section of the (n+1)th QB node (QB(n+1)). When the (n+1)th QB node (QB(n+1)) is charged, the (n+1)th QB node (QB(n+1)) is not influenced by the voltage of the (n+1)th Q node (Q(n+1)), which is not completely discharged. Thus, deterioration in charge capability of the (n+1)th QB node (QB(n+1)) can be prevented.

Figure 6:
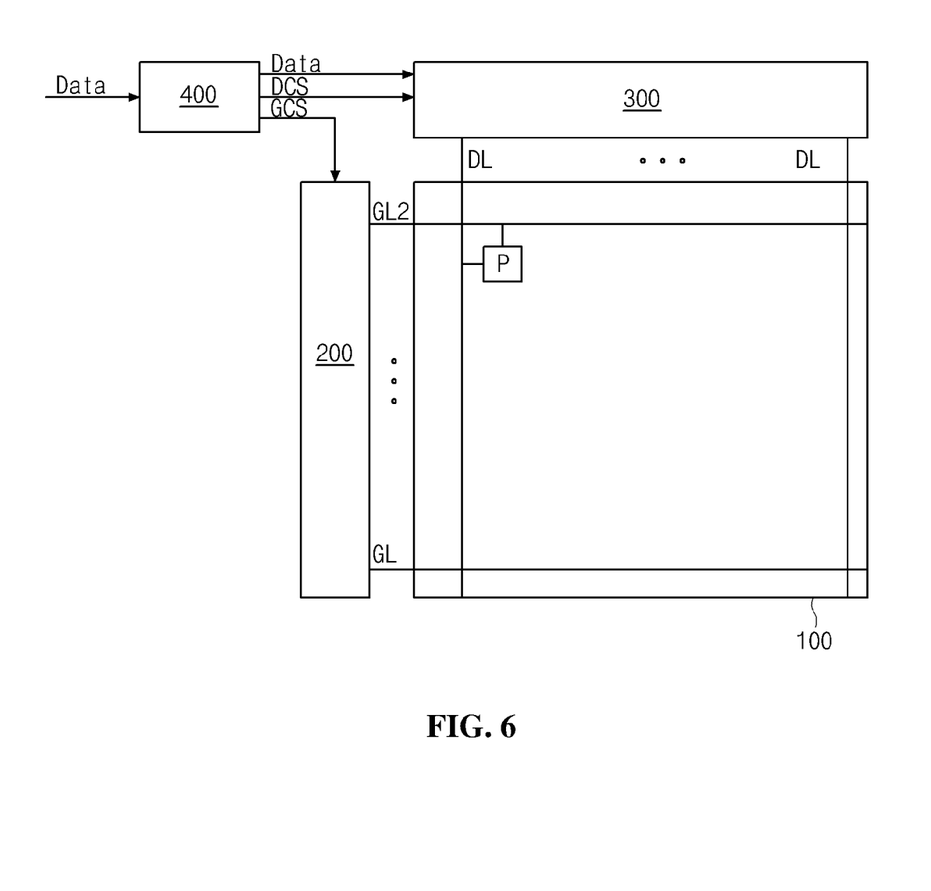
FIG. 6 is a view illustrating a display device according to the embodiment of the present disclosure.

FIG. 6 is a view illustrating a display device according to the embodiment of the present disclosure.

Hereinafter, the display device according to the embodiment of the present disclosure will be described with reference to FIG. 3, FIG. 4 and FIG. 6.

In FIG. 3, FIG. 4, and FIG. 6, the display device according to the embodiment of the present disclosure includes a display panel 100, a gate driving unit 200, a data driving unit 300, and a timing controller 400. The display panel 100 includes gate lines GL, data lines DL crossing the gate lines GL, and pixels P connected to the gate lines GL and the data lines DL. The gate driving unit 200 is connected to the gate lines GL, and the data driving unit 300 is connected to the data lines DL. The timing controller 400 controls the gate driving unit 200 and the data driving unit 300.

In detail, the timing controller 400 generates a gate control signal GCS of controlling an operation timing of the gate driving unit 200 and a data control signal DCS of controlling an operation timing of the data driving unit 300 using a vertical synchronization signal Vsync, a horizontal synchronization signal Hsync, a data enable signal DE, and so on transmitted from an external system such as a graphic card or a television system. The timing controller 400 supplies the gate control signal GCS to the gate driving unit 200 and supplies the data control signal DCS to the data driving unit 300.

In addition, the timing controller 400 outputs an image data Data from the external system to the data driving unit 300.

The gate driving unit 200 includes first to nth (n is an integer larger than 2) stages and a dummy stage.

At this time, the first to nth stages sequentially output first to nth gate pulses Vout1 to Vout(n) to the gate lines GL, respectively, according to a start signal Vst. The dummy stage receives the nth gate pulse Vout(n), charges an (n+1)th Q node (Q(n+1)), and outputs a dummy pulse Vout(n+1) synchronized with a clock signal Clk. The dummy stage receives a reset signal Rst and discharges the (n+1)th Q node (Q(n+1)).

In addition, the nth stage receives a gate pulse of a previous stage, that is, the (n−1)th stage, and charges an nth Q node (Q(n)). The nth stage receives the dummy pulse Vout(n+1) and discharges the nth Q node (Q(n)).

Moreover, the first to nth stages receive the reset signal Rst and charge first QB to nth QB nodes (QB1 to QB(n)), respectively.

Furthermore, the dummy stage receives the start signal Vst and charges an (n+1)th QB node (QB(n+1)).

Accordingly, the dummy stage receives the reset signal Rst and discharges the charged (n+1)th Q node (Q(n+1)). Then, the dummy stage charges the (n+1)th QB node (QB(n+1)) according to the start signal Vst sequentially outputted after the reset signal Rst is outputted. Therefore, a discharging section of the (n+1)th Q node (Q(n+1)) does not overlap a charging section of the (n+1)th QB node (QB(n+1)).

That is, when the (n+1)th QB node (QB(n+1)) is charged, the (n+1)th QB node (QB(n+1)) is not influenced by a voltage of the (n+1)th Q node (Q(n+1)), which is not completely discharged. Thus, the (n+1)th QB node (QB(n+1)) is sufficiently charged to have an enough voltage for operation.

Moreover, the dummy stage includes a first charge and discharge portion, a second charge and discharge portion, a pull-up transistor T6, and a pull-down transistor T7. The first charge and discharge portion charges or discharges the (n+1)th Q node (Q(n+1)). The second charge and discharge portion charges or discharges the (n+1)th QB node (QB(n+1)). The pull-up transistor T6 outputs the dummy pulse Vout(n+1), and the pull-down transistor T7 outputs a low level voltage Vss.

Accordingly, in the display device according to the embodiment of the present disclosure, even though the positive bias stress PBTS is accumulated to the gate electrodes of the transistors switched corresponding to the voltage of the (n+1)th QB node (QB(n+1)) of the dummy stage and the transistors are degraded, the (n+1)th Q node (Q(n+1)) having the high level voltage Vdd is discharged by the reset signal Rst, and thereby preventing deterioration in charge capability of the (n+1)th QB node (QB(n+1)).

Meanwhile, in the figure, the gate driving unit 200 is mounted to a different substrate from the display panel 100 in an integrated circuit form. Alternatively, the gate driving unit 200 may be formed in a non-display area of the display panel 100 together when thin film transistors are formed in a display area of the display panel 100.

Additionally, the gate driving unit 200 may be disposed at one of a left side and a right side of the display panel 100 and may provide the gate pulses in one direction. Alternatively, the gate driving unit 200 may be disposed at both the left side and the right side of the display panel 100 and may provide the gate pulses in two directions.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

What is claimed is:

1. A gate driving unit comprising:
   first to nth stages sequentially outputting first to nth gate pulses, respectively, according to a start signal, wherein n is an integer larger than 2; and
   a dummy stage receiving the nth gate pulse, charging an (n+1)th Q node and outputting a dummy pulse synchronized with a clock signal, wherein the dummy stage receives a reset signal which turns on a transistor and discharges the (n+1)th Q node,
   wherein the first to nth stages receive the reset signal and charge first QB to nth QB nodes, respectively, and deterioration in charge capability of an (n+1)th QB node is prevented by discharging the (n+1)th Q node with a high level voltage to a low level voltage by the reset signal.

2. The gate driving unit of claim 1, wherein the dummy stage receives the start signal and charges the (n+1)th QB node.

3. The gate driving unit of claim 2, wherein the start signal is sequentially outputted after the reset signal is outputted.

4. The gate driving unit of claim 2, wherein the (n+1)th Q node has a discharging section not overlapping a charging section of the (n+1)th QB node.

5. The gate driving unit of claim 2, wherein the nth stage receives the gate pulse of the (n−1)th stage and charges an nth Q node, and the nth stage receives the dummy pulse and discharges the nth Q node.

6. The gate driving unit of claim 5, wherein the dummy stage comprises:
   a first charge and discharge portion charging and discharging the (n+1)th Q node;
   a second charge and discharge portion charging and discharging the (n+1)th QB node;
   a pull-up transistor outputting the dummy pulse; and
   a pull-down transistor outputting a low level voltage.

7. The gate driving unit of claim 6, wherein the first charge and discharge portion comprises:
   a first transistor including a gate electrode connected to an nth gate pulse output terminal, a first electrode connected to a high level voltage terminal, and a second electrode connected to the (n+1)th Q node;
   a second transistor including a gate electrode connected to a reset signal line, a first electrode connected to the (n+1)th Q node, and a second electrode connected to a low level voltage terminal; and
   a third transistor including a gate electrode connected to the (n+1)th QB node, a first electrode connected to the (n+1)th Q node, and a second electrode connected to the low level voltage terminal.

8. The gate driving unit of claim 7, wherein the second charge and discharge portion comprises:
   a fourth transistor including a gate electrode connected to the (n+1)th Q node, a first electrode connected to the (n+1)th QB node, and a second electrode connected to the low level voltage terminal; and
   a fifth transistor including a gate electrode connected to a start signal line, a first electrode connected to the high level voltage terminal, and a second electrode connected to the (n+1)th QB node.

9. The gate driving unit of claim 8, wherein the pull-up transistor includes a gate electrode connected to the (n+1)th Q node, a first electrode connected to a clock signal line, and a second electrode connected to a dummy pulse output terminal, and wherein the pull-down transistor includes a gate electrode connected to the (n+1)th QB node, a first electrode connected to the dummy pulse output terminal, and a second electrode connected to the low level voltage terminal.

10. A display device comprising:
a display panel including gate lines and data lines crossing each other;
a data driving unit connected to the data lines;
a gate driving unit connected to the gate lines and including first to nth stages and a dummy stage, wherein the first to nth stages sequentially output first to nth gate pulses, respectively, according to a start signal, wherein n is an integer larger than 2, wherein the dummy stage receives the nth gate pulse, charges an (n+1)th Q node and outputs a dummy pulse synchronized with a clock signal, and the dummy stage receives a reset signal which turns on a transistor and discharges the (n+1)th Q node, and wherein the first to nth stages receive the reset signal and charge first QB to nth QB nodes, respectively, and deterioration in charge capability of an (n+1)th QB node is prevented by discharging the (n+1)th QB node with a high level voltage to a low level voltage by the reset signal; and
a timing controller controlling the data driving unit and the gate driving unit.

11. The display device of claim 10, wherein the dummy stage receives the start signal and charges the (n+1)th QB node.

12. The display device of claim 11, wherein the start signal is sequentially outputted after the reset signal is outputted.

13. The display device of claim 11, wherein the (n+1)th Q node has a discharging section not overlapping a charging section of the (n+1)th QB node.

14. The display device of claim 11, wherein the nth stage receives the gate pulse of the (n−1)th stage and charges an nth Q node, and the nth stage receives the dummy pulse and discharges the nth Q node.

15. The display device of claim 14, wherein the dummy stage comprises:
a first charge and discharge portion charging and discharging the (n+1)th Q node;
a second charge and discharge portion charging and discharging the (n+1)th QB node;
a pull-up transistor outputting the dummy pulse; and
a pull-down transistor outputting a low level voltage.

16. A gate driving unit comprising:
first to nth stages sequentially outputting first to nth gate pulses, respectively, according to a start signal, wherein n is an integer larger than 2; and
a dummy stage receiving the nth gate pulse, charging an (n+1)th Q node, and
outputting a dummy pulse synchronized with a clock signal, wherein the dummy stage receives a reset signal which turns on a transistor and discharges the (n+1)th Q node,
wherein the first to nth stages receive the reset signal and charge first QB to nth QB nodes, respectively,
wherein the reset signal has a high level and a low level during one frame, the start signal has a low level when the reset signal has the high level, and the reset signal has the low level when the start signal has a high level, and
wherein deterioration in charge capability of an (n+1)th QB node is prevented by discharging the (n+1)th Q node with a high level voltage to a low level voltage by the reset signal.

17. The gate driving unit of claim 16, wherein the dummy stage receives the start signal and charges the (n+1th QB node.

18. The gate driving unit of claim 17, wherein the (n+1)th Q node has a discharging section that does not overlap a charging section of the (n+1)th QB node.

* * * * *